United States Patent [19]
Dijkmans et al.

[11] Patent Number: 4,517,525
[45] Date of Patent: May 14, 1985

[54] BALANCING COMPENSATION IN DIFFERENTIAL AMPLIFIERS WITH A SINGLE-ENDED DRIVE

[76] Inventors: Eise C. Dijkmans; Rudy J. van de Plassche, both of Groenewoudseweg 1, Eindhoven, Netherlands

[21] Appl. No.: 445,334

[22] Filed: Nov. 29, 1982

[30] Foreign Application Priority Data

Dec. 9, 1981 [NL] Netherlands ............. 8105536

[51] Int. Cl.³ ............. H03F 1/14; H03F 3/45
[52] U.S. Cl. ............. 330/260; 330/292
[58] Field of Search ............. 330/76, 78, 112, 156, 330/260, 292, 294

[56] References Cited

U.S. PATENT DOCUMENTS 3,292,098 12/1966 Bensing ............. 330/260 X
4,417,216 11/1983 Davis ............. 330/294

Primary Examiner—James B. Mullins
Assistant Examiner—Steven J. Mottola

[57] ABSTRACT

A differential amplifier with single-ended drive includes a balancing impedance (20) coupled between the base of the transistor (3) connected to the signal input (1) and the common point (9) of the two emitters of the transistors (3,4), which form a differential pair. The capacitance value of the capacitor (20) is substantially equal to the capacitance value of the stray capacitance (19) of the collector-substrate junction of a transistor (10) which forms a current source. This provides a symmetry of the capacitances between the input (1) and the common point (9) and between the common point (9) and ground via the transistor (10). This results in an improved balance in the output signals at the output terminals (5,6) and a flat frequency response of the differential amplifier for higher frequencies.

8 Claims, 3 Drawing Figures

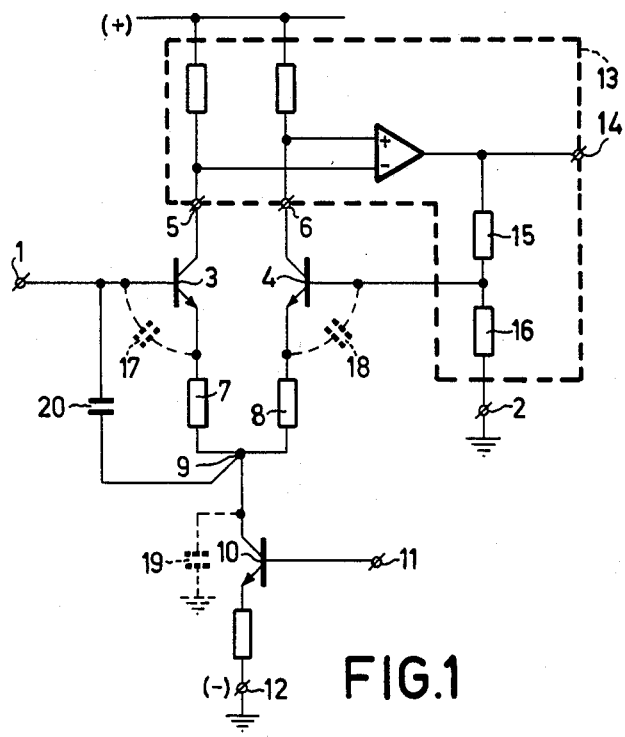
FIG.1
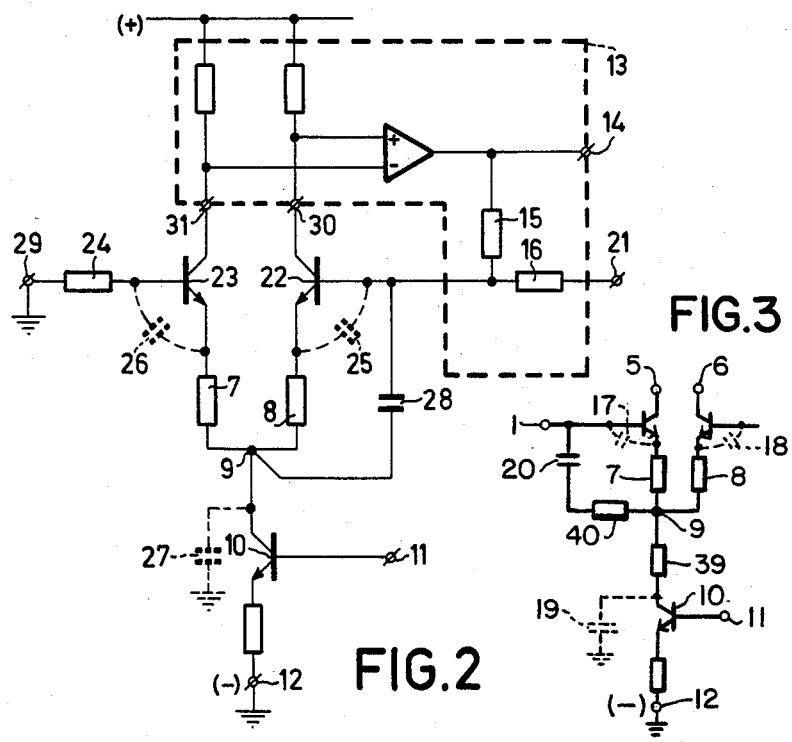
FIG.2
FIG.3

BALANCING COMPENSATION IN DIFFERENTIAL AMPLIFIERS WITH A SINGLE-ENDED DRIVE

This invention relates to a differential amplifier comprising a first input and a second input, the first input being adapted to receive an input signal and the second input being coupled to a first point of constant potential, a first output and a second output for supplying two output signals which are in phase-opposition and depend on the input signal, a first transistor having a control electrode, a first main electrode and a second main electrode coupled to the first input, the first output and, if required via a respective impedance, to a common point respectively, a second transistor having a control electrode, a first main electrode and a second main electrode coupled to the second input, the second output, and if required via a respective impedance to the common point respectively, and a third transistor arranged as a current source and having a first main electrode coupled to the common point and a second main electrode coupled to a second point of constant potential. Such a differential amplifier is known from U.S. Pat. No. 4,365,206.

A differential amplifier of the general kind set forth above is a differential stage with a single-ended drive. In the ideal case half the amplitude of the input signal appears at the common point. The output signals at the first output and the second output are then of equal amplitude and opposite phase. However, in practice this is found not to be so unless further steps are taken. The two output signals are found to exhibit an asymmetry, as a result of which higher frequencies are not amplified correctly. The invention, just like the disclosure in said Offenlegungsschrift, aims at mitigating this incorrect amplification at higher frequencies. In addition, the invention seeks to achieve this object in a simpler manner than with the known method, so that the circuit arrangement is also simplified. According to the invention the differential amplifier is characterized in that a balancing impedance which comprises at least a capacitance is arranged between the control electrode of the first transistor and the common point. This capacitance preferably has a capacitance value which is at least substantially equal to the value of the stray capacitance between the first main electrode of the third transistor and the second point of constant potential. If an impedance is arranged between the common point and the first main electrode of the third transistor, the balancing impedance preferably also includes an impedance whose value is equal to that of the first-mentioned impedance and which is arranged in series with the capacitance.

The invention is based on the insight that the asymmetry in the differential amplifier is caused by an asymmetry of the stray capacitances in the differential amplifier. These stray capacitances are specifically the stray capacitances between the control electrode and the second main electrode of the first transistor and of the second transistor (base-emitter capacitances) and the stray capacitance between the first main electrode of the third transistor and the second point of constant potential or ground (the collector-substrate capacitance and the collector-base capacitance).

Hereinafter, it is assumed that no additional impedances are present between the second main electrodes (emitters) of the first and second transistors and the common point and between the common point and the first main electrode (collector) of the third transistor. Moreover, for the sake of convenience, the control electrode, the first main electrode and the second main electrode of a transistor are often referred to herein as the base, the collector, and the emitter, respectively.

Now the following asymmetry arises relative to the common point. On the one hand a parallel arrangement of the stray capacitance between the base and emitter of the second transistor and the stray capacitance corresponding to the collector-substrate capacitance and the collector-base capacitance of the third transistor is situated between the common point and (in fact) ground. On the other hand, the stray capacitance between the base and the emitter of the first transistor is situated between the input of the differential amplifier and the common point. As a result of this asymmetry the input signal is no longer distributed in such a way that the common point is at half the signal voltage. In order to restore the symmetry in the differential amplifier a balancing impedance comprising a capacitor is now arranged in parallel with the base-emitter junction of the first transistor. The capacitance of the capacitor is equal to the capacitance corresponding to the collector-substrate stray capacitance and the collector-base stray capacitance of the third transistor. This restores the capacitive symmetry in the differential amplifier relative to the common point.

If two impedances are arranged between the emitter of the first transistor and the common point and between the emitter of the second transistor and the common point respectively, which impedances will generally be equal, this will not influence the symmetry relative to the common point. However, said balancing capacitor should then be arranged between the base of the first transistor and the common point (i.e. not the emitter of the first transistor). Furthermore, it is possible to arrange a further impedance between the common point and the collector of the third transistor. In that case a balancing impedance whose impedance value is equal to the impedance value of the series arrangement of said impedance between the common point and the collector of the third transistor and the total stray capacitance of the third transistor between its collector and (ultimately) ground should be arranged between the base of the first transistor and the common point. In the Figures:

FIG. 1 shows a first embodiment,
FIG. 2 a second embodiment of the invention, and
FIG. 3 is a modified embodiment of FIG. 1.

The differential amplifier shown in FIG. 1 comprises first and second inputs 1 and 2 respectively. The first input 1 is adapted to receive an input signal and the second input 2 is coupled to a first point of constant potential (in this case ground). The differential amplifier comprises first and second transistors 3 and 4 respectively whose bases are coupled, as the case may be via a corresponding impedance to be described hereinafter (for transistor 4 the impedance 16), to the first and second inputs 1 and 2 respectively. The collectors of transistors 3 and 4 are coupled to first and second outputs 5 and 6 respectively, and their emitters are coupled to a common point 9, either directly or via impedances 7 and 8, respectively (see FIG. 1). These impedances will generally have equal impedance values. The common point 9 is coupled to a second point of constant potential 12, which is the negative terminal of the supply voltage (in this case also ground), via a current source in the form of a third transistor 10 and, if required, via an impedance. The base of transistor 10 is coupled to a terminal 11 to which a reference voltage is applied in operation. This reference voltage determines the value of the current from the current source. Respective output signals which are in phase-opposition and depend on the input signal are available at the first output and the second output. If instead it is required to have a single output signal, this may be achieved by means of a known converter unit, of which an example is shown in the Figures—see the part referenced as 13. The output signal is then available at terminal 14.

The converter unit 13 will not be discussed in more detail because it is known per se and is not particularly relevant to the present invention. The only point to be noted as regards the converter unit is that the impedances 15 ($Z_1$) and 16 ($Z_2$), between the terminal 14 and the base of transistor 4 and between the base of transistor 4 and the second input 2 respectively, determine the gain factor of the differential amplifier. This gain factor is the ratio of the amplitude on terminal 14 to that of the input signal on input 1 and is equal to $1+Z_1/Z_2$ (assuming the gain of the differential amplifier in converter unit 13 to be very large). Suitably, in order to obtain a correct balance, an impedance will be arranged between the input 1 and the base of transistor 3, the value of said impedance being equal to the impedance value of the parallel arrangement of the impedances $Z_1$ and $Z_2$. Thus, the input signal is applied to the non-inverting input of the differential amplifier, while the inverting input 2 is at a fixed level. This results in a differential stage with a single-ended drive in which in the ideal case half the amplitude of the input signal is available at the common point 9. The output signals at the first and second outputs 5 and 6 respectively are then of equal amplitude but opposite phase.

However, in practice it is found that this is not the case if the arrangement includes only the components so far described; the two output signals exhibit an asymmetry which is the result of an asymmetry of the various stray capacitances in the differential amplifier. These stray capacitances are denoted by the reference numerals 17, 18 and 19, and respectively represent the stray capacitance of the base-emitter junction of transistor 3, and stray capacitance of the base-emitter junction of transitor 4, and the total stray capacitance of transistor 10 between its collector and ground as viewed from its collector. This last-mentioned stray capacitance comprises the stray capacitance of the collector-substrate junction and the stray capacitance of the collector-base junction of transistor 10. In effect, these two stray capacitances are arranged in parallel with each other between the collector of transistor 10 and ground.

An asymmetry of stray capacitances exists relative to the common point 9, namely on the one hand the parallel combination of the stray capacitances 18 and 19 to ground and, on the other hand, a stray capacitance 17 to the input 1, i.e. to the base of transistor 3. In order to compensate for this asymmetry, in accordance with the invention a balancing impedance in the form of a capacitor 20 is arranged between the base of transistor 3 and the common point 9. The value of the capacitor is selected to be equal to the stray capacitance 19.

It is evident that if a further impedance 39 (FIG. 3) were included between the common point 9 and the collector of transistor 10, the capacitor 20 between the base of transistor 3 and the common point 9 should be replaced by a balancing impedance including the capacitor 20 in series with a resistor 40. The value of the balancing impedance 20, 40 is equal to the impedance of the series arrangement of the said further impedance and the stray capacitance 19.

FIG. 2 shows a further embodiment. Parts of FIGS. 1 and 2 bearing the same reference numerals are identical. The circuit arrangement bears a strong resemblance to that of FIG. 1. The first input 21, to which the input signal may be applied, is now the inverting input of the differential amplifier. The input 21 is coupled to the base of the first transistor 22 via the impedance 16. The base of the second transistor 23 is coupled to the second input 29, if required via an impedance 24. The second input 29 is coupled to a point of constant potential (in the present case ground). The first output and the second output are denoted by 30 and 31 respectively. The impedance value of the impedance 24 is suitably equal to the impedance value of the parallel arrangement of the impedances 15 ($Z_1$) and 16 ($Z_2$) in order to obtain a correct balance. The gain factor of the circuit arrangement, which is the ratio of the amplitude of the signal at terminal 14 to that of the input signal at input 21, is again equal to $Z_1/Z_2$ (assuming the gain of the differential amplifier in converter unit 13 to be very large). Again stray capacitances 25 and 26 exist between the base and the emitter of the transistor 22 and between the base and the emitter of transistor 23 respectively and between the collector and the substrate (ground) of transistor 10 (27). Again there is an asymmetry relative to the common point 9, namely the parallel arrangement of the stray capacitances 26 and 27 between the common point 9 and ground, and the stray capacitance 25 between the common point 9 and the base of transistor 22. By arranging a balancing capacitor 28, whose capacitance value is equal to that of the stray capacitance 27, between the common point 9 and the base of transistor 22, the differential amplifier is balanced again. If an additional impedance were included between the common point 9 and the collector of transistor 10, an equivalent impedance should also be arranged in series with the capacitor 28 between point 9 and the base of transistor 22. It is to be noted that the invention is not limited to the embodiments described. The invention also applies to differential amplifiers which differ from those described with respect to points which do not concern the inventive idea. For example, it is possible to use field-effect transistors (such as MOS transistors) instead of bipolar transistors in the circuit arrangement.

What is claimed is:

1. A differential amplifier comprising a first input adapted to receive an input signal and a second input coupled to a first point of constant potential, a first output and a second output for supplying two output signals which are in phase-opposition and depend on the input signal, a first transistor having a control electrode, a first main electrode and a second main electrode coupled to the first input, the first output and to a common point respectively, a second transistor having a control electrode, a first main electrode and a second main electrode coupled to the second input, the second output and to the common point respectively, and a third transistor arranged as a current source and having a first main electrode coupled to the common point and a second main electrode coupled to a second point of constant potential, and a balancing impedance which comprises at least a capacitor coupled between the control electrode of the first transistor and the common point.

2. A differential amplifier as claimed in claim 1, wherein said capacitor has a capacitance value which is substantially equal to the value of a stray capacitance between the first main electrode of the third transistor and the second point of constant potential.

3. A differential amplifier as claimed in claim 1, further comprising a first impedance coupled between the common point and the first main electrode of the third transistor, and wherein the balancing impedance further includes an impedance equal to the first impedance and connected in series with the capacitor.

4. A differential amplifier as claimed in claim 2 further comprising a first impedance coupled between the common point and the first main electrode of the third transistor, and wherein the balancing impedance further comprises an impedance element equal to the first impedance and connected in series with the capacitor between the control electrode of the first transistor and the common point.

5. A differential amplifier as claimed in claim 1 wherein the second main electrodes of the first and second transistors are coupled to said common point via first and second impedance elements, respectively.

6. A differential amplifier as claimed in claim 2 wherein the second main electrodes of the first and second transistors are coupled to said common point via first and second impedance elements, respectively.

7. A differential amplifier as claimed in claim 1 further comprising a high gain amplifier having first and second inputs coupled to said first and second outputs, respectively, and an output for supplying a single-ended output signal, and first and second impedance elements connected in series between said amplifier output and said second input and with a junction point therebetween coupled to the control electrode of the second transistor.

8. A differential amplifier as claimed in claim 1 further comprising a high gain amplifier having first and second inputs coupled to said first and second outputs, respectively, and an output for supplying a single-ended output signal, first and second impedance elements connected in series between said amplifier output and said first input and with a junction point therebetween coupled to the control electrode of the first transistor, and a third impedance element coupled between the control electrode of the second transistor and the second input, and wherein the impedance of the third impedance element is equal to the impedance of the parallel arrangement of the first and second impedance elements.

* * * * *

UNITED STATES PATENT AND TRADEMARK OFFICE
CERTIFICATE OF CORRECTION

PATENT NO.   : 4,517,525
DATED        : May 14, 1985
INVENTOR(S)  : EISE C. DIJKMANS ET AL

It is certified that error appears in the above-identified patent and that said Letters Patent is hereby corrected as shown below:

On the Title Page:

The "Assignee" and the "Attorney, Agent, or Firm" is missing

Please add -- Assignee:   U.S. Philips Corporation, New York, N.Y.-- and
--Attorney, Agent, or Firm- Robert T. Mayer; Bernard Franzblau--

Signed and Sealed this

Eighteenth Day of March 1986

[SEAL]

Attest:

DONALD J. QUIGG

Attesting Officer

Commissioner of Patents and Trademarks